(12) United States Patent
Yoda (10) Patent No.: US 12,451,631 B2
(45) Date of Patent: Oct. 21, 2025

(54) INTERCONNECT SUBSTRATE INCLUDING SUBSTRATES AND CONNECTOR DISPOSED IN RECESS

(71) Applicant: SHINKO ELECTRIC INDUSTRIES CO., LTD., Nagano (JP)

(72) Inventor: Atsuto Yoda, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 318 days.

(21) Appl. No.: 18/160,365

(22) Filed: Jan. 27, 2023

(65) Prior Publication Data

US 2023/0246362 A1    Aug. 3, 2023

(30) Foreign Application Priority Data

Feb. 3, 2022 (JP) ................... 2022-015631

(51) Int. Cl.
*H01R 12/72* (2011.01)
*H01R 12/52* (2011.01)
(Continued)

(52) U.S. Cl.
CPC .......... *H01R 12/722* (2013.01); *H01R 12/52* (2013.01); *H05K 1/14* (2013.01); *H05K 1/144* (2013.01);
(Continued)

(58) Field of Classification Search
CPC ...... H01R 12/722; H01R 12/52; H01R 12/51; H01R 12/523; H01R 12/71; H01R 12/712;
(Continued)

(56) References Cited

U.S. PATENT DOCUMENTS 10,903,170 B2 * 1/2021 Lee ..................... H01L 23/5384
2006/0033199 A1 2/2006 Kawakami et al.
(Continued)

FOREIGN PATENT DOCUMENTS

JP 2003-347685 12/2003
JP 2006-054274 2/2006
(Continued)

OTHER PUBLICATIONS

Office Action mailed on Jul. 15, 2025 with respect to the corresponding Japanese application No. 2022-015631.

*Primary Examiner* — Justin M Kratt
(74) *Attorney, Agent, or Firm* — IPUSA, PLLC (57) ABSTRACT

An interconnect substrate includes a first interconnect substrate having a first electrode on a first surface and having a recess formed in an edge in a plan view normal to the first surface, a second interconnect substrate having a second electrode on a second surface facing toward the first surface, a connector disposed inside the recess and electrically connected to the first interconnect substrate, an intermediate substrate disposed between the first interconnect substrate and the second interconnect substrate, the intermediate substrate including an insulating base and a conductive via, the insulating base having a through hole extending from a third surface facing the first surface to a fourth surface facing the second surface, the conductive via being disposed in the through hole, a first conductive member electrically connecting the first electrode and the conductive via, and a second conductive member electrically connecting the second electrode and the conductive via.

10 Claims, 11 Drawing Sheets

(51) Int. Cl.
  *H05K 1/14* (2006.01)
  *H05K 3/36* (2006.01)
  *H01L 23/31* (2006.01)
  *H01L 23/498* (2006.01)
  *H01L 23/538* (2006.01)
  *H01L 25/16* (2023.01)
  *H01R 12/51* (2011.01)
  *H01R 12/71* (2011.01)

(52) U.S. Cl.
  CPC .......... *H05K 3/368* (2013.01); *H01L 23/3128* (2013.01); *H01L 23/49811* (2013.01); *H01L 23/49816* (2013.01); *H01L 23/49827* (2013.01); *H01L 23/538* (2013.01); *H01L 23/5385* (2013.01); *H01L 23/5386* (2013.01); *H01L 25/165* (2013.01); *H01R 12/51* (2013.01); *H01R 12/523* (2013.01); *H01R 12/71* (2013.01); *H01R 12/712* (2013.01); *H01R 12/714* (2013.01); *H01R 12/716* (2013.01); *H01R 12/718* (2013.01); *H01R 12/728* (2013.01); *H05K 1/145* (2013.01); *H05K 3/36* (2013.01); *H05K 2201/04* (2013.01); *H05K 2201/042* (2013.01); *H05K 2201/095* (2013.01); *H05K 2201/09545* (2013.01); *H05K 2201/096* (2013.01); *H05K 2201/10227* (2013.01); *H05K 2201/10234* (2013.01); *H05K 2201/10378* (2013.01); *H05K 2201/10734* (2013.01)

(58) Field of Classification Search
  CPC .. H01R 12/714; H01R 12/716; H01R 12/718; H01R 12/728; H05K 1/14; H05K 1/144; H05K 3/368; H05K 1/145; H05K 3/36; H05K 2201/04; H05K 2201/042; H05K 2201/095; H05K 2201/09545; H05K 2201/096; H05K 2201/10227; H05K 2201/10234; H05K 2201/10378; H05K 2201/10734; H01L 23/3128; H01L 23/49811; H01L 23/49816; H01L 23/49827; H01L 23/538; H01L 23/5385; H01L 23/5386; H01L 25/165
  See application file for complete search history.

(56) References Cited

U.S. PATENT DOCUMENTS

2011/0299250 A1* 12/2011 Harao ................. H01R 12/728
  29/846
2021/0242134 A1 8/2021 Yamanishi et al.

FOREIGN PATENT DOCUMENTS

| JP | 2012-015475 | 1/2012 | |
|----|-------------|--------|--|
| JP | 2021-125570 | 8/2021 | |
| WO | WO-9950909 A1 * | 10/1999 | ............ H01L 23/32 |

* cited by examiner

INTERCONNECT SUBSTRATE INCLUDING SUBSTRATES AND CONNECTOR DISPOSED IN RECESS

CROSS-REFERENCE TO RELATED APPLICATIONS

The present application is based on and claims priority to Japanese Patent Application No. 2022-015631 filed on Feb. 3, 2022, with the Japanese Patent Office, the entire contents of which are incorporated herein by reference.

FIELD

The disclosures herein relate to interconnect substrates.

BACKGROUND

Some interconnect substrates known in the art have a recess formed in a part of the perimeter of the substrate and a connector provided inside the recess.

In a related-art interconnect substrate having a recess formed in the substrate, an area available for mounting electronic components on the substrate is reduced by the area used for forming the recess.

It may be preferable to provide an interconnect substrate capable of providing a wide area for mounting electronic components.

[Patent Document 1] Japanese Laid-Open Patent Publication No. 2012-15475

SUMMARY

According to an aspect of the embodiment, an interconnect substrate includes a first interconnect substrate having a first electrode on a first surface thereof and having a recess formed in an edge thereof in a plan view normal to the first surface, a second interconnect substrate having a second electrode on a second surface thereof facing toward the first surface, a connector disposed inside the recess and electrically connected to the first interconnect substrate, an intermediate substrate disposed between the first interconnect substrate and the second interconnect substrate, the intermediate substrate including an insulating base and a conductive via, the insulating base having a through hole extending from a third surface thereof facing the first surface to a fourth surface thereof facing the second surface, the conductive via being disposed in the through hole, a first conductive member electrically connecting the first electrode and the conductive via, and a second conductive member electrically connecting the second electrode and the conductive via.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, the embodiment will be described with reference to the accompanying drawings. In the specification and drawings, elements having substantially the same functions or configurations are referred to by the same numerals, and a duplicate description thereof may be omitted. In the present disclosures, the X1-X2 direction, the Y1-Y2 direction, and the Z1-Z2 direction are orthogonal to each other. A plane that includes the X1-X2 direction and the Y1-Y2 direction is referred to as an XY plane. A plane that includes the Y1-Y2 direction and the Z1-Z2 direction is referred to as a YZ plane. A plane that includes the Z1-Z2 direction and the X1-X2 direction is referred to as a ZX plane. For the sake of convenience, the Z1-Z2 direction is referred to as a vertical direction. Also, the Z1 side is referred to as an upper side, and the Z2 side is referred to as a lower side. A "plan view" refers to a view of an object as taken from the Z1 side. A "plane shape" refers to the shape of an object as appears when viewed from the Z1 side. It may be noted, however, that the interconnect substrate may be used in an upside-down position, or may be placed at any angle.

First Embodiment

Figure 1:
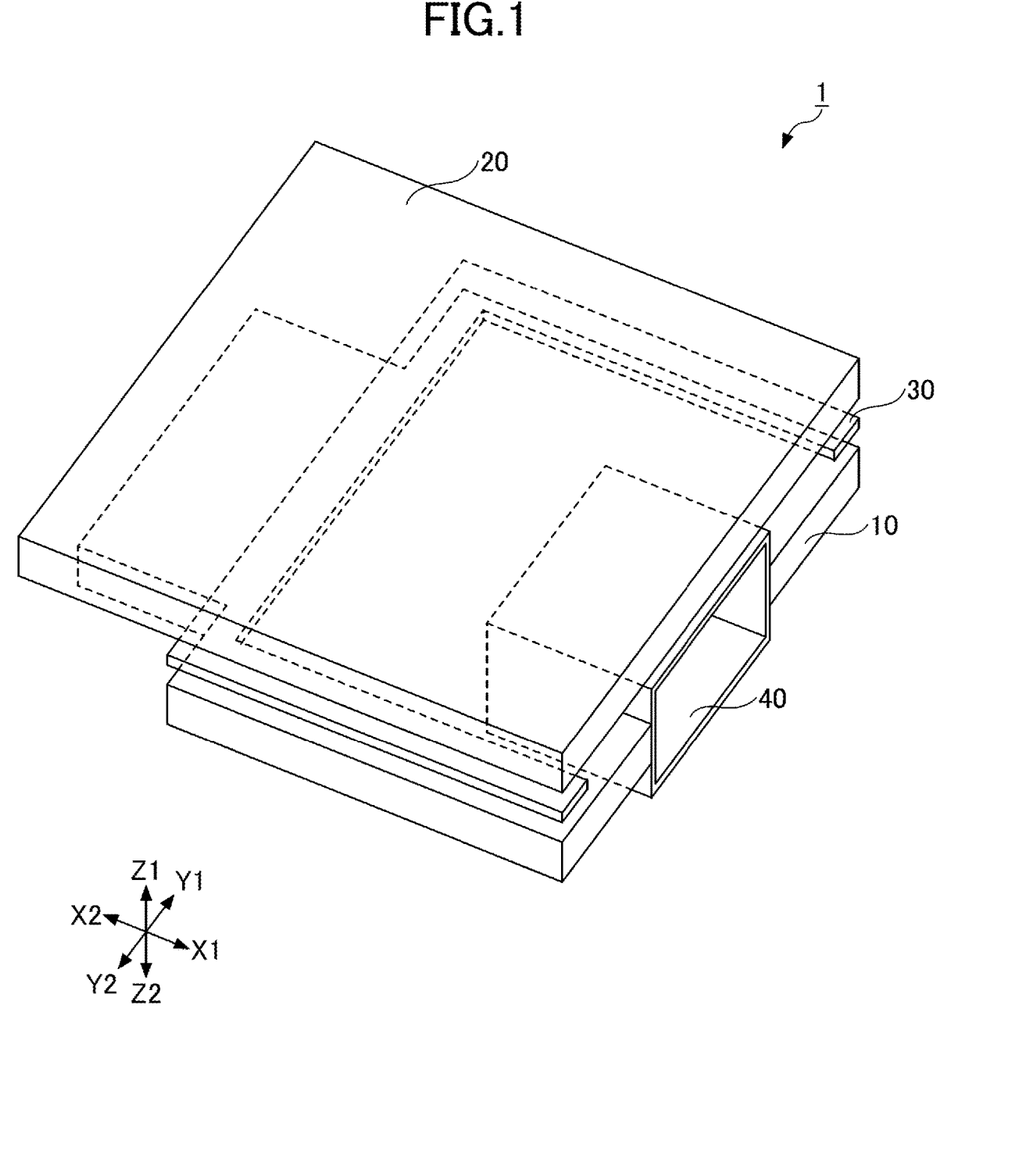
FIG. 1 is an axonometric view illustrating an interconnect substrate according to a first embodiment.
Figure 2:
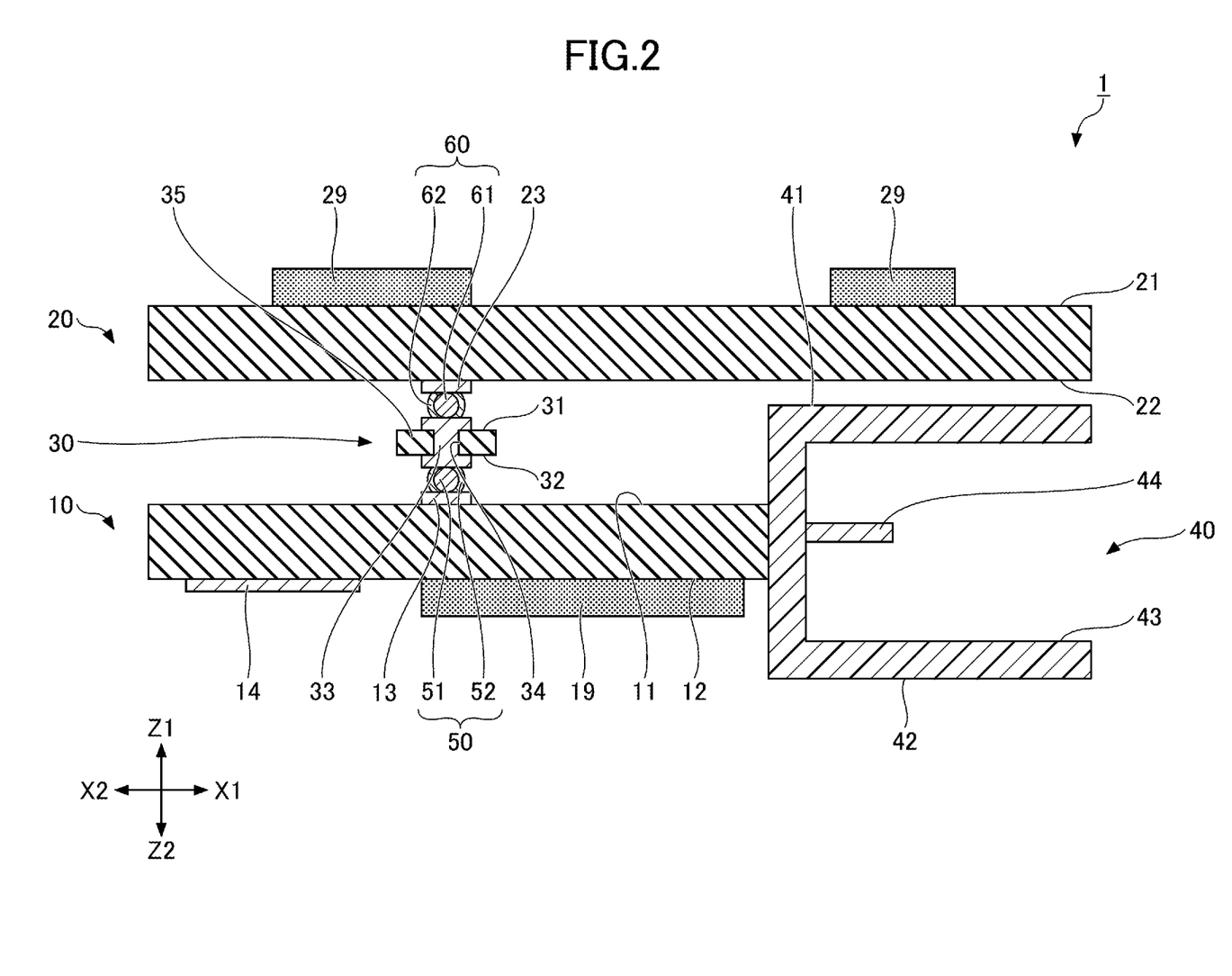
FIG. 2 is a cross-sectional view illustrating the interconnect substrate according to the first embodiment.
Figure 3:
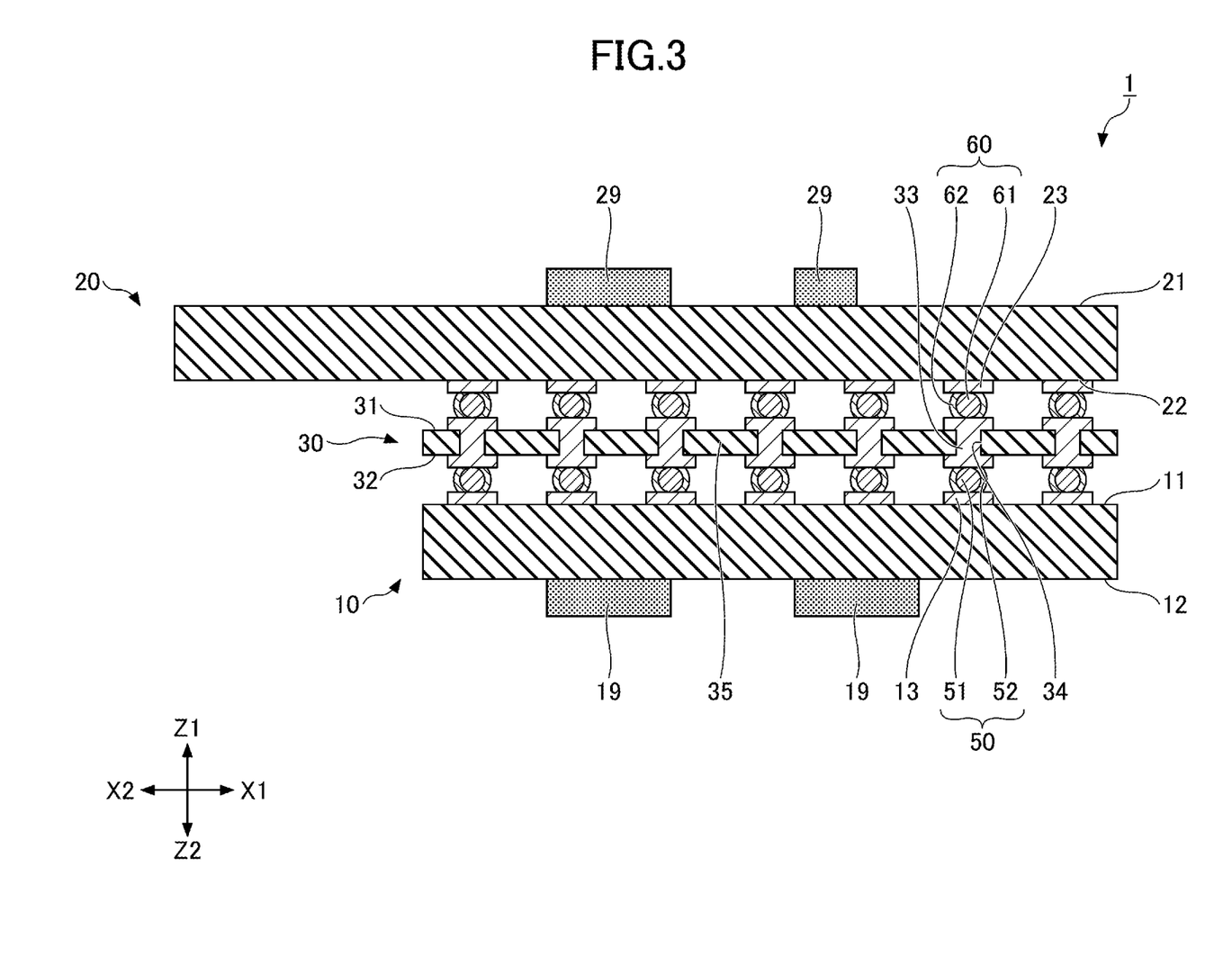
FIG. 3 is a cross-sectional view illustrating the interconnect substrate according to the first embodiment.

The first embodiment is directed to an interconnect substrate. FIG. 1 is an axonometric view illustrating an interconnect substrate according to a first embodiment. FIGS. 2 and 3 are cross-sectional views illustrating the interconnect substrate according to the first embodiment. FIG. 2 is a cross-sectional view taken along the line II-II in FIGS. 4 through 9, which will be described later. FIG. 3 is a cross-sectional view taken along the line III-III in FIGS. 4 through 9.

The interconnect substrate 1 according to the first embodiment includes a first interconnect substrate 10, a second interconnect substrate 20, an intermediate substrate 30, a connector 40, first conductive members 50, and second conductive members 60. The second interconnect substrate 20 is provided on the Z1 side (upper side) of the first interconnect substrate 10. The intermediate substrate 30 is provided between the first interconnect substrate 10 and the second interconnect substrate 20. That is, the intermediate substrate 30 is provided on the Z1 side (upper side) of the first interconnect substrate 10 and on the Z2 side (lower side) of the second interconnect substrate 20.

[First Interconnect Substrate 10 and Connector 40]

Figure 4:
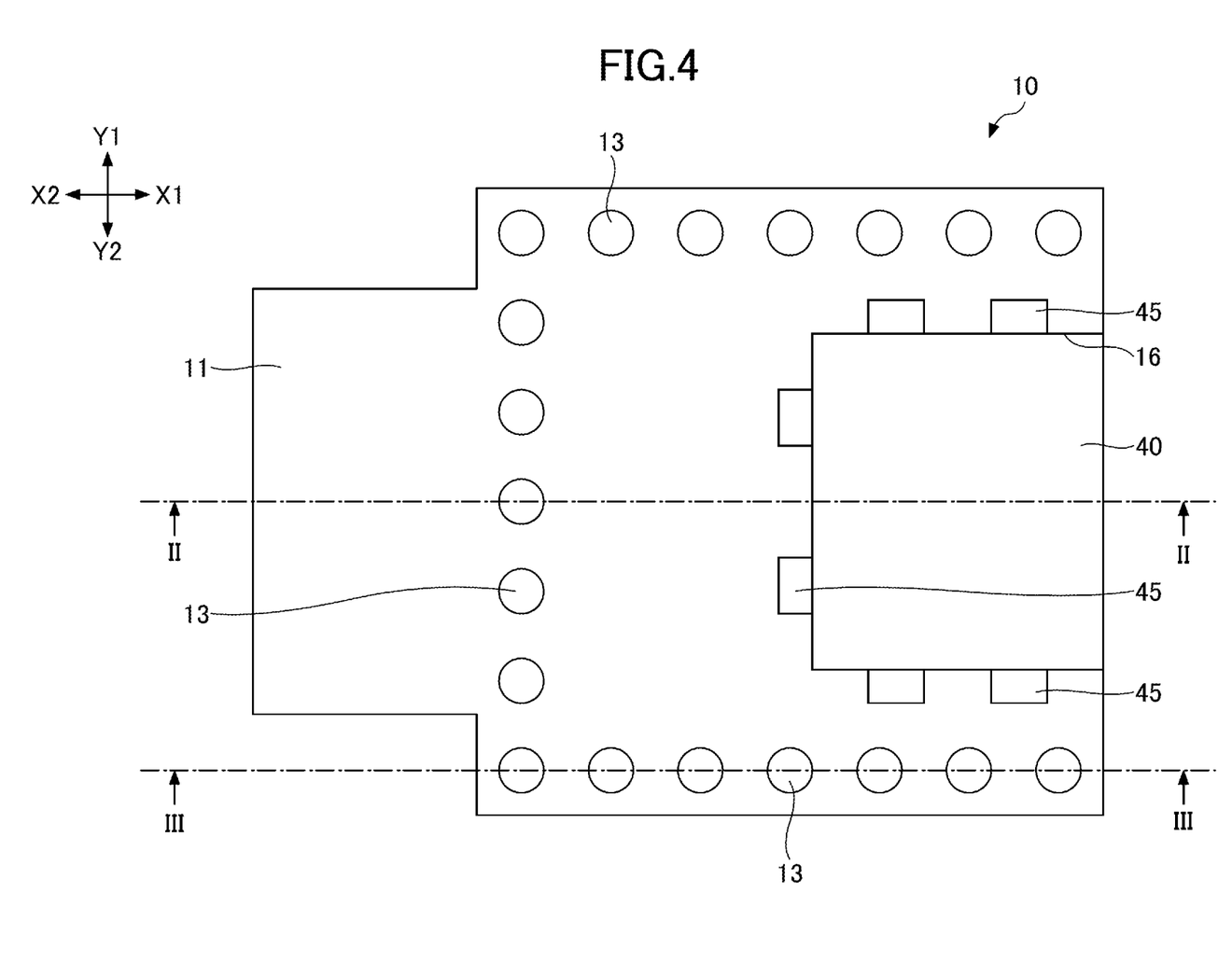
FIG. 4 is a top view illustrating a first interconnect substrate and a connector.
Figure 5:
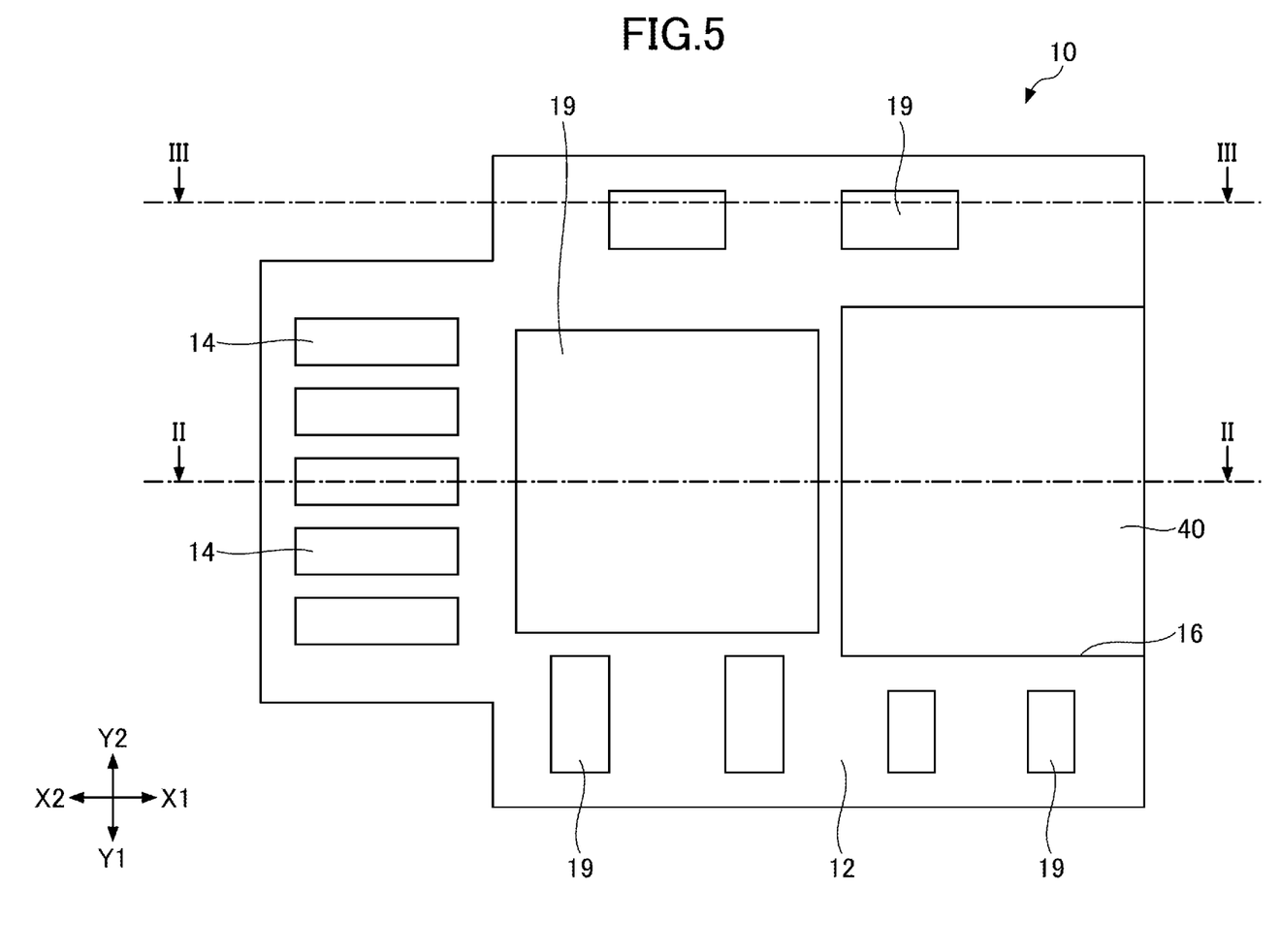
FIG. 5 is a bottom view illustrating the first interconnect substrate and the connector.

In the following, the first interconnect substrate 10 and the connector 40 will be described. FIG. 4 is a top view illustrating the first interconnect substrate 10 and the connector 40. FIG. 5 is a bottom view illustrating the first interconnect substrate 10 and the connector 40.

The first interconnect substrate 10 has an upper surface 11 and a lower surface 12. The first interconnect substrate 10 has a substantially rectangular plane shape. The first interconnect substrate 10 includes one or more insulating layers and one or more interconnect layers. The number of interconnect layers is, for example, four, but is not limited to a particular number. The material of the insulating layers is, for example, glass epoxy or the like, and the material of the interconnect layers is, for example, copper (Cu) or the like. In plan view, the first interconnect substrate 10 has two edges parallel to the X1-X2 direction and two edges parallel to the Y1-Y2 direction. A recess 16 is formed in the X1-side edge among the two edges parallel to the Y1-Y2 direction. The connector 40 is disposed inside the recess 16.

As illustrated in FIG. 2, the connector 40 has an upper surface 41 and a lower surface 42. The upper surface 41 of the connector 40 is further toward the Z1 side (upper side) than the upper surface 11 of the first interconnect substrate 10, and the lower surface 42 of the connector 40 is further toward the Z2 side (lower side) than the lower surface 12 of the first interconnect substrate 10. The connector 40 has an opening 43 facing toward the X1 side, and has terminals 44 inside the opening 43. The connector 40 is electrically connected to the first interconnect substrate 10. For example, the terminals 44 are electrically connected to the first interconnect substrate 10. As illustrated in FIG. 4, the connector 40 is fixed to, for example, fixing parts 45 provided on the upper surface 11 of the first interconnect substrate 10. For example, the connector 40 is soldered to the first interconnect substrate 10 at the fixing parts 45.

As illustrated in FIGS. 2, 3, and 5, a plurality of connection terminals 14 are provided on the lower surface 12 of the first interconnect substrate 10. The plurality of connection terminals 14 are provided in the vicinity of the X2-side edge among the two edges of the first interconnect substrate 10 parallel to the Y1-Y2 direction. Each of the connection terminals 14 has a substantially rectangular plane shape whose long sides are parallel the X1-X2 direction, for example. The plurality of connection terminals 14 are arrayed in the Y1-Y2 direction.

A plurality of electronic components 19 are mounted on the lower surface 12 of the first interconnect substrate 10. The electronic components 19 are further toward the X1 side than the connection terminals 14. The electronic components 19 may be an active component or a passive component. Examples of the electronic components 19 include an integrated circuit chip, a capacitor chip, a resistor chip, and the like.

As illustrated in FIGS. 2, 3, and 4, a plurality of first electrodes 13 are provided on the upper surface 11 of the first interconnect substrate 10. Some of the plurality of first electrodes 13 are arrayed in the X1-X2 direction in the vicinity of the two edges of the first interconnect substrate 10 parallel to the X1-X2 direction. The remaining ones of the plurality of first electrodes 13 are arrayed in the Y1-Y2 direction on the X1 side of the connection terminals 14. The pitch of the first electrodes 13 is, for example, about 500 μm to 1000 μm.

[Second Interconnect Substrate 20]

Figure 6:
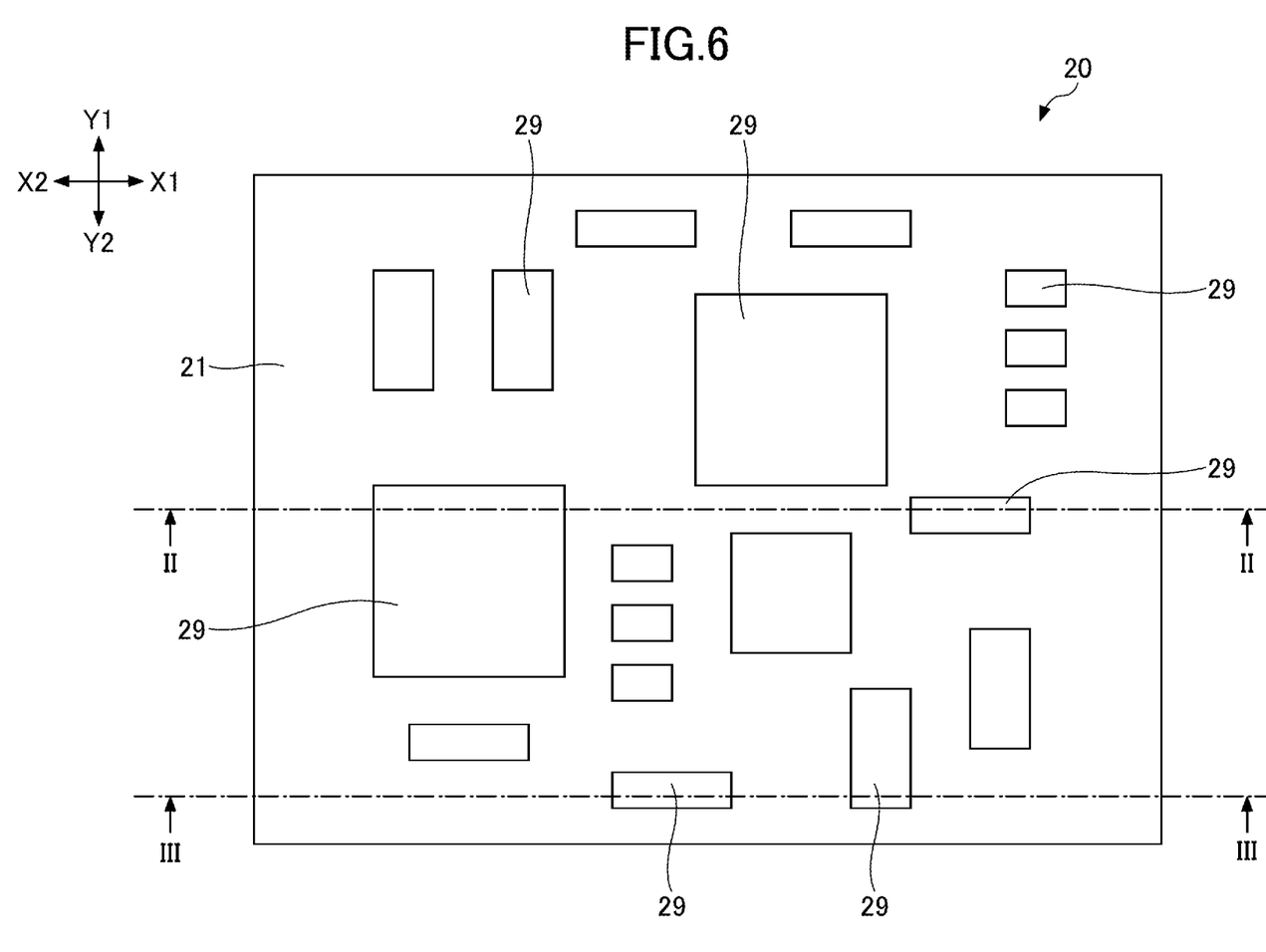
FIG. 6 is a top view illustrating a second interconnect substrate.
Figure 7:
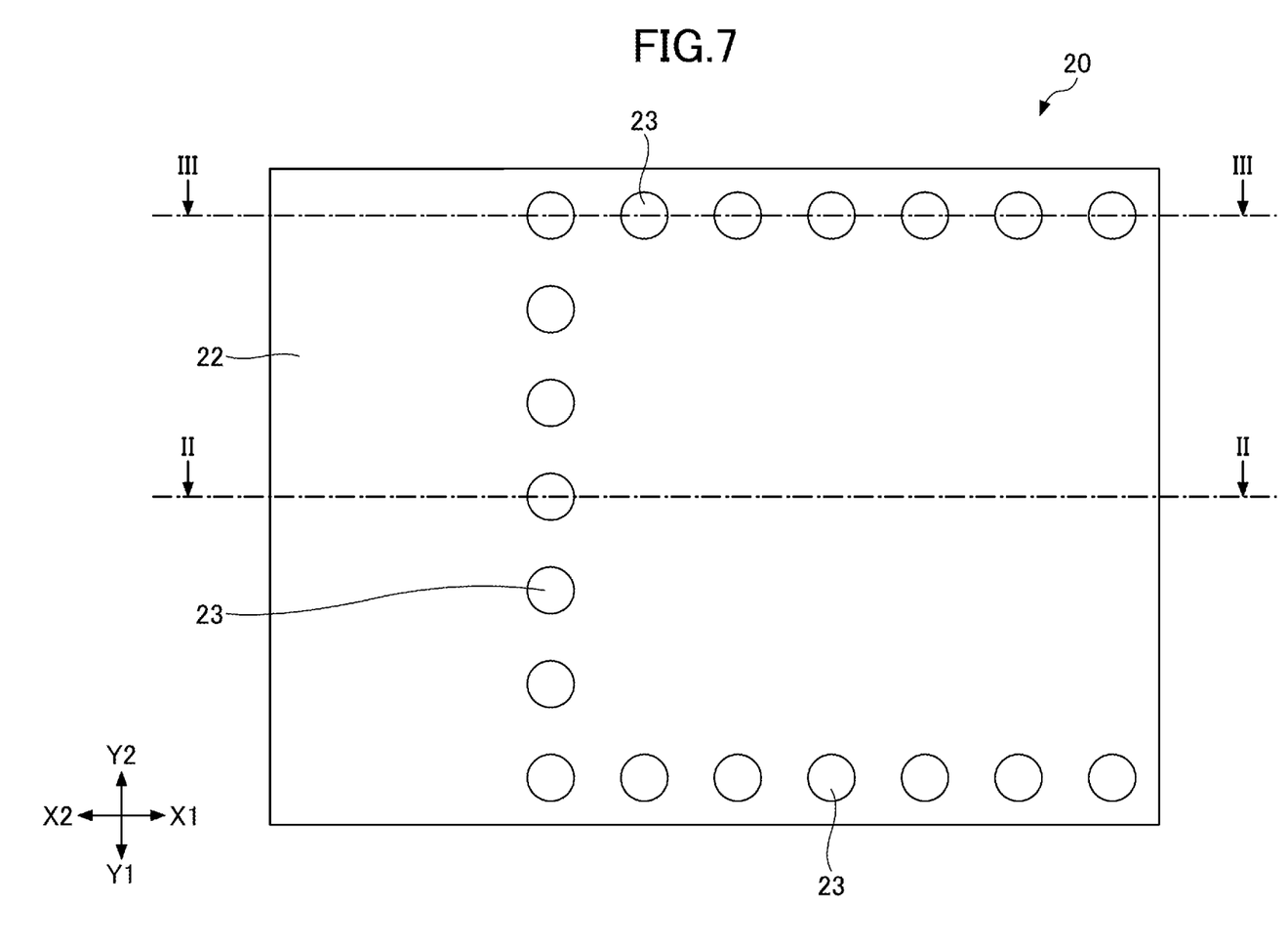
FIG. 7 is a bottom view illustrating the second interconnect substrate.

In the following, the second interconnect substrate 20 will be described. FIG. 6 is a top view illustrating the second interconnect substrate 20. FIG. 7 is a bottom view illustrating the second interconnect substrate 20.

The second interconnect substrate 20 has an upper surface 21 and a lower surface 22. The lower surface 22 of the second interconnect substrate 20 faces the upper surface 11 of the first interconnect substrate 10. The second interconnect substrate 20 has a substantially rectangular plane shape. The second interconnect substrate 20 includes one or more insulating layers and one or more interconnect layers. The number of interconnect layers is, for example, four, but is not limited to a particular number. The material of the insulating layers is, for example, glass epoxy or the like, and the material of the interconnect layers is, for example, copper or the like. The second interconnect substrate 20 includes, for example, four interconnect layers (not illustrated). In plan view, the second interconnect substrate 20 has two edges parallel to the X1-X2 direction and two edges parallel to the Y1-Y2 direction.

As illustrated in FIGS. 2, 3, and 6, a plurality of electronic components 29 are mounted on the upper surface 21 of the second interconnect substrate 20. The electronic components 29 may be an active component or a passive component. Examples of the electronic components 29 include an integrated circuit chip, a capacitor chip, a resistor chip, and the like.

As illustrated in FIGS. 2, 3, and 7, a plurality of second electrodes 23 are provided on the lower surface 22 of the second interconnect substrate 20. Some of the plurality of second electrodes 23 are arrayed in the X1-X2 direction in the vicinity of the two edges of the second interconnect substrate 20 parallel to the X1-X2 direction. The remaining ones of the plurality of second electrodes 23 are arrayed in the Y1-Y2 direction on the X1 side of the connection terminals 14 disposed on the first interconnect substrate 10 in plan view. In plan view, each of the plurality of first electrodes 13 is situated at the same position as a corresponding one of the plurality of second electrodes 23. The pitch of the second electrodes 23 is, for example, about 500 μm to 1000 μm.

The second interconnect substrate 20 overlaps the first interconnect substrate 10 and the connector 40 in plan view. For example, at least a portion of the connector 40 overlaps the second interconnect substrate 20 in plan view. Preferably, the entirety of the connector 40 overlaps the second interconnect substrate 20 in plan view.

[Intermediate Substrate 30]

Figure 8:
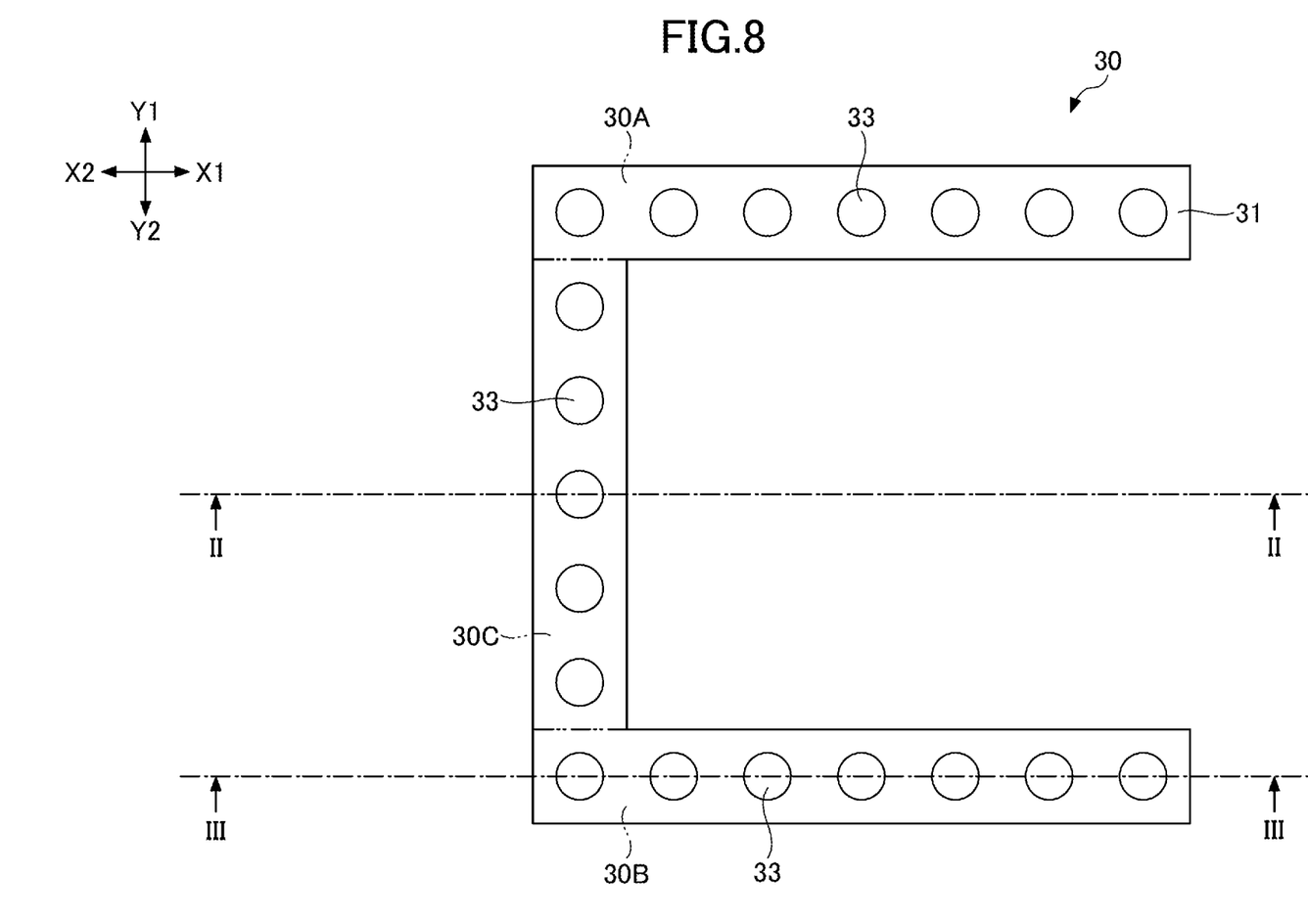
FIG. 8 is a top view illustrating an intermediate substrate according to the first embodiment.
Figure 9:
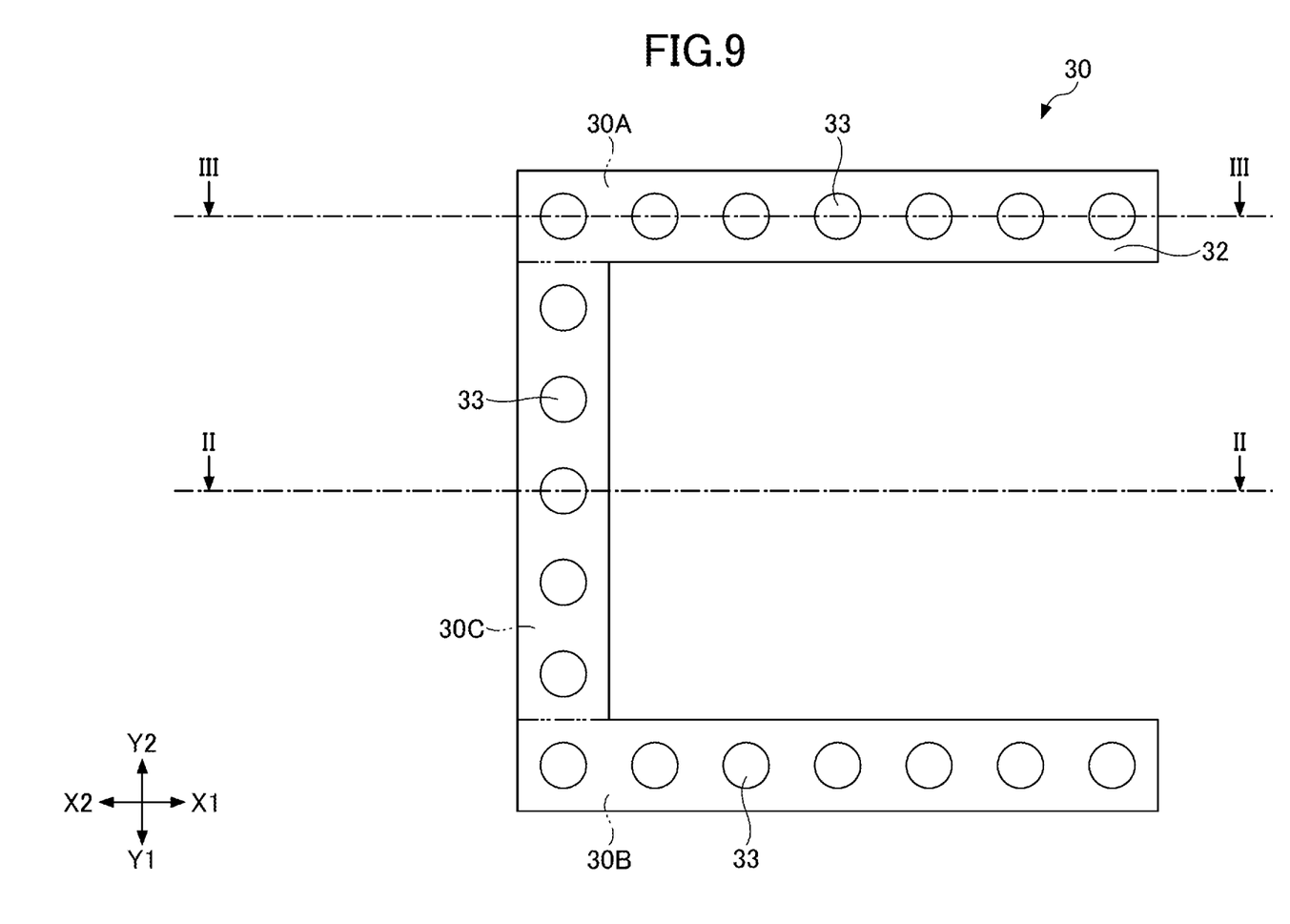
FIG. 9 is a bottom view illustrating the intermediate substrate according to the first embodiment.

In the following, the intermediate substrate 30 will be described. FIG. 8 is a top view illustrating the intermediate substrate 30 according to the first embodiment. FIG. 9 is a bottom view illustrating the intermediate substrate 30 according to the first embodiment.

The intermediate substrate 30 includes an insulating base 35. The material of the base 35 is glass epoxy or the like, for example. The base 35 has an upper surface 31 and a lower surface 32. The lower surface 32 of the base 35 faces the upper surface 21 of the first interconnect substrate 10, and the upper surface 31 of the base 35 faces the lower surface 22 of the second interconnect substrate 20. The base 35 has a substantially U-shaped plane shape. The base 35 includes a first region 30A extending in the X1-X2 direction, a second region 30B extending in the X1-X2 direction, and a third region 30C extending in the Y1-Y2 direction. The second region 30B is situated on the Y2 side of the first region 30A. The third region 30C connects the X2-side end of the first region 30A and the X2-side end of the second region 30B.

A plurality of through holes 34 extending from the lower surface 32 to the upper surface 31 are formed through the base 35. Each of the through holes 34 is formed at the same position as a corresponding one of the first electrodes 13 and a corresponding one of the second electrodes 23 in plan view. The diameter of the through holes 34 is, for example, about 100 µm to 200 µm. The pitch of the through holes 34 is, for example, about 500 µm to 1000 µm. The intermediate substrate 30 has conductive vias 33 provided in the through holes 34. The material of the conductive vias 33 is copper or the like, for example. The conductive vias 33 may include a portion covering the upper surface 31, and may include a portion covering the lower surface 32.

[First Conductive Member 50]

In the following, the first conductive members 50 will be described. The interconnect substrate 1 includes the first conductive members 50. Each of the first conductive members 50 is in direct contact with a corresponding one of the first electrodes 13 and a corresponding one of the conductive vias 33. The first conductive member 50 electrically connects the first electrode 13 and the conductive via 33. The first conductive member 50 includes a first conductive core ball 51 and a first solder layer 52, for example. The first conductive core ball 51 contains copper, for example. The first conductive core ball 51 may be a copper core ball. The first solder layer 52 covers the first conductive core ball 51. The material of the first solder layer 52 is, for example, a Sn (tin)-based, Sn—Ag (silver)-based, Sn—Cu-based, or Sn—Ag—Cu-based Pb (lead)-free solder.

[Second Conductive Member 60]

In the following, the second conductive members 60 will be described. The interconnect substrate 1 includes the second conductive members 60. Each of the second conductive members 60 is in direct contact with a corresponding one of the second electrodes 23 and a corresponding one of the conductive vias 33. The second conductive member 60 electrically connects the second electrode 23 and the conductive via 33. The second conductive member 60 includes a second conductive core ball 61 and a second solder layer 62, for example. The second conductive core ball 61 contains copper, for example. The second conductive core ball 61 may be a copper core ball. The second solder layer 62 covers the second conductive core ball 61. The material of the second solder layer 62 is, for example, the same as the material of the first solder layer 52.

The interconnect substrate 1 according to the first embodiment includes the second interconnect substrate 20 in addition to the first interconnect substrate 10 having the connector 40 connected thereto. Because of this, even with the presence of the recess 16 in the first interconnect substrate 10, a wide area for mounting electronic components is provided. In particular, the configuration in which at least a portion of the connector 40 overlaps the second interconnect substrate 20 in plan view is conducive to the provision of a wide area for mounting electronic components.

In addition, with the provision of the connector 40 inside the recess 16, the height of the interconnect substrate 1 (the size in the Z1-Z2 direction) is reduced, compared with the case in which the connector 40 is surface-mounted on the first interconnect substrate 10.

The size of the interconnect substrate 1 in the X1-X2 direction may be about 15 mm to 30 mm, and the size of the interconnect substrate 1 in the Y1-Y2 direction may be about 10 mm to 30 mm, with the size of the interconnect substrate 1 in the Z1-Z2 direction being about 3 mm to 10 mm, for example.

Furthermore, the intermediate substrate 30 is provided between the first interconnect substrate 10 and the second interconnect substrate 20. This arrangement makes it possible to adjust the distance between the first interconnect substrate 10 and the second interconnect substrate 20 in accordance with the size of the connector 40. In addition, although the first interconnect substrate 10 having the recess 16 formed therein is easily warped compared to the case in which the recess 16 is not formed, the intermediate substrate 30 reduces the likelihood of warpage of the first interconnect substrate 10. In this manner, the first embodiment provides excellent stability in shape.

Second Embodiment

Figure 10:
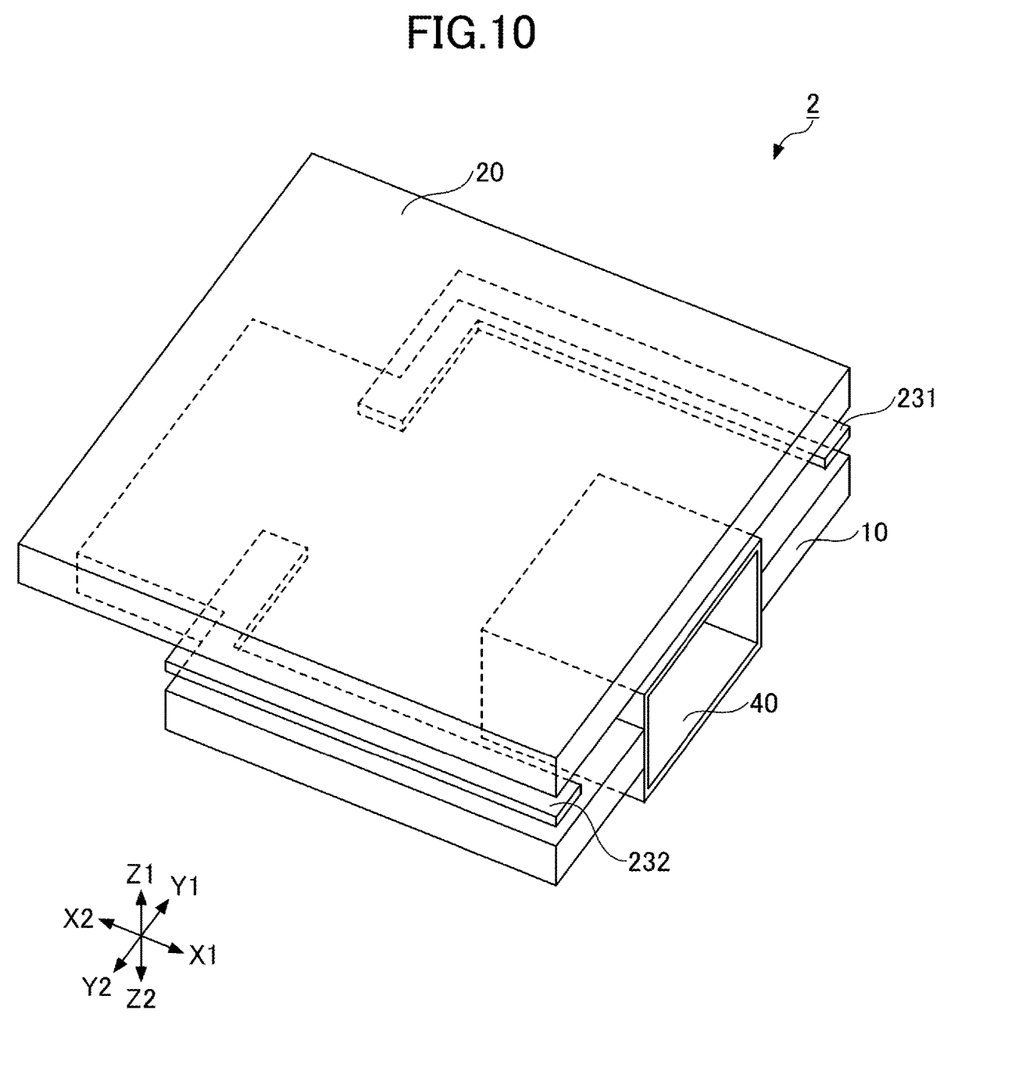
FIG. 10 is an axonometric view illustrating an interconnect substrate according to the second embodiment.
Figure 11:
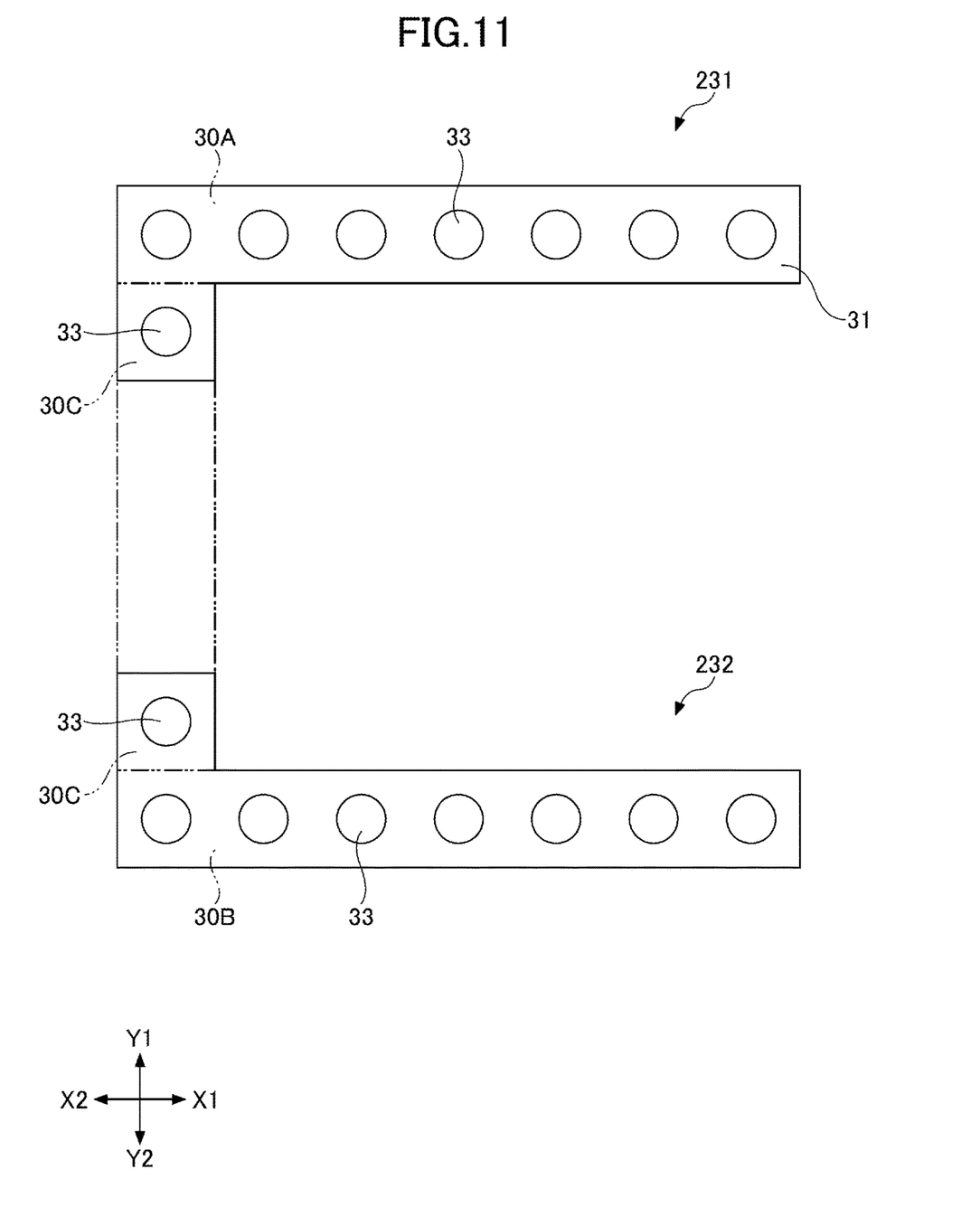
FIG. 11 is a top view illustrating an intermediate substrate according to the second embodiment.

There will now be a description of a second embodiment. The second embodiment differs from the first embodiment mainly in the configuration of an intermediate substrate. FIG. 10 is an axonometric view illustrating an outline of an interconnect substrate according to the second embodiment. FIG. 11 is a top view illustrating an intermediate substrate according to the second embodiment.

The interconnect substrate 2 according to the second embodiment includes intermediate substrates 231 and 232 in place of the intermediate substrate 30. The intermediate substrate 231 corresponds to the first region 30A of the intermediate substrate 30 and that portion of the third region 30C which is connected to the first region 30A. The intermediate substrate 232 corresponds to the second region 30B of the intermediate substrate 30 and that portion of the third region 30C which is connected to the second region 30B. In other words, the intermediate substrates 231 and 232 are formed by removing part of the third region 30C of the intermediate substrate 30. The base 35 of each of the intermediate substrates 231 and 232 has a substantially L-shaped plane shape. Similarly to the intermediate substrate 30, the through holes 34 and the conductive vias 33 are provided in each of the intermediate substrates 231 and 232.

Although not illustrated, the first interconnect substrate 10 has the first electrodes 13 provided at the same positions as the conductive vias 33 in plan view, and the second interconnect substrate 20 has the second electrodes 23 provided at the same positions as the conductive vias 33 in plan view. As in the first embodiment, each of the first conductive members 50 is in direct contact with a corresponding one of the first electrodes 13 and a corresponding one of the conductive vias 33, and each of the second conductive members 60 is in direct contact with a corresponding one of the second electrodes 23 and a corresponding one of the conductive vias 33.

The remaining configurations are the same as those of the first embodiment.

According to the second embodiment, the same effects as those of the first embodiment are achieved. In addition, in the second interconnect substrate 20, a region where the second electrodes 23 are not provided is larger than that of the first embodiment. With this arrangement, this region may be utilized to form an interconnect layer and to connect a connector also to the X2-side edge of the second interconnect substrate 20.

In the present disclosure, the number and plane shape of intermediate substrates are not limited to those described heretofore. For example, the interconnect substrate may include three or more intermediate substrates. Further, the intermediate substrate may have a substantially I-shaped plane shape, for example.

In the present disclosure, the first conductive member and the second conductive member do not have to include a conductive core ball. For example, the first conductive member and the second conductive member may be made of solder without including a conductive core ball.

According to the disclosed technique, it is possible to secure a wide region where electronic components can be mounted.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. An interconnect substrate, comprising:
    a first interconnect substrate having a first electrode on a first surface thereof and having a recess formed in an edge thereof in a plan view normal to the first surface;
    a second interconnect substrate having a second electrode on a second surface thereof facing toward the first surface;
    a connector disposed inside the recess and electrically connected to the first interconnect substrate;
    an intermediate substrate disposed between the first interconnect substrate and the second interconnect substrate, the intermediate substrate including an insulating base and a conductive via, the insulating base having a through hole extending from a third surface thereof facing the first surface to a fourth surface thereof facing the second surface, the conductive via being disposed in the through hole;
    a first conductive member electrically connecting the first electrode and the conductive via; and
    a second conductive member electrically connecting the second electrode and the conductive via,
    wherein the insulating base of the intermediate substrate does not overlap the connector in the plan view, and includes a first region and a second region, the first region extending in a predetermined direction in the plan view, the second region located opposite the first region across the recess in the plan view and extending in the predetermined direction in the plan view.

2. The interconnect substrate as claimed in claim 1, wherein at least a part of the connector overlaps the second interconnect substrate in the plan view.

3. The interconnect substrate as claimed in claim 2, wherein an entirety of the connector overlaps the second interconnect substrate in the plan view.

4. The interconnect substrate as claimed in claim 1, further comprising:
    a first electronic component mounted on a fifth surface of the first interconnect substrate opposite the first surface thereof; and
    a second electronic component mounted on a sixth surface of the second interconnect substrate opposite the second surface thereof.

5. The interconnect substrate as claimed in claim 4, wherein the second electronic component mounted on the sixth surface overlaps at least a portion of the connector in the plan view.

6. The interconnect substrate as claimed in claim 1, comprising a plurality of said intermediate substrates.

7. The interconnect substrate as claimed in claim 1, wherein the first conductive member includes a first conductive core ball, and the second conductive member includes a second conductive core ball.

8. The interconnect substrate as claimed in claim 7, wherein the first conductive core ball and the second conductive core ball contain copper.

9. The interconnect substrate as claimed in claim 7, wherein the first conductive member includes a first solder layer covering the first conductive core ball, and the second conductive member includes a second solder layer covering the second conductive core ball.

10. The interconnect substrate as claimed in claim 1, wherein the insulating base of the intermediate substrate has a U-shaped planar shape.

* * * * *